United States Patent [19]

Den Boef

[11] Patent Number: 4,812,762

[45] Date of Patent: Mar. 14, 1989

[54] FAST METHOD AND DEVICE FOR DETERMINING AN NMR DISTRIBUTION IN A REGION OF A BODY

[75] Inventor: Johannes H. Den Boef, Eindhoven, Netherlands

[73] Assignee: U.S. Philips Corp., New York, N.Y.

[21] Appl. No.: 136,515

[22] Filed: Dec. 22, 1987

Related U.S. Application Data

[63] Continuation of Ser. No. 774,129, Sep. 9, 1985, abandoned.

[30] Foreign Application Priority Data

Sep. 28, 1984 [NL] Netherlands ................... 8402959

[51] Int. Cl.[4] ........................................... G01R 33/20
[52] U.S. Cl. .................................. 324/309; 324/307
[58] Field of Search ............... 324/300, 307, 309, 311, 324/312, 313, 314; 128/653

[56] References Cited

U.S. PATENT DOCUMENTS

| | | | |
|---|---|---|---|
| 4,165,479 | 8/1979 | Mansfield | 324/309 |
| 4,333,053 | 6/1982 | Harrison et al. | 324/309 |
| 4,509,015 | 4/1985 | Ordidge et al. | 324/309 |
| 4,527,124 | 7/1985 | van Uijen | 324/309 |
| 4,551,680 | 11/1985 | Macovski | 324/309 |
| 4,570,120 | 2/1986 | Hall et al. | 324/309 |
| 4,639,671 | 1/1987 | Macovski | 324/309 |
| 4,651,096 | 3/1987 | Buonocore | 324/309 |
| 4,678,996 | 7/1987 | Haacke et al. | 324/309 |

FOREIGN PATENT DOCUMENTS 0127480 12/1984 European Pat. Off. .

OTHER PUBLICATIONS

M. M. Tropper, Image Reconstruction ... Acquisition, J. Mag. Res. 42, (1981) pp. 193-202.

Primary Examiner—Michael J. Tokar
Attorney, Agent, or Firm—Thomas A. Briody; Jack E. Haken; Jack D. Slobod

[57] ABSTRACT

The invention relates to a method of making NMR images (density distributions, location-dependent spectroscopy) utilizing two alternating gradient fields whose gradient directions are mutually perpendicular. Thus, a two-dimensional "plane" in the 3-D image frequency space can be filled with a uniform density of measurement points. Per FID signal more signal samples can be taken, resulting in a substantial reduction of the entire measurement procedure for a 3-D image. This method is very suitable for imaging of 3-D density distributions, 2-D or 3-D spectroscopy etc. The periods and the amplitudes of the alternating gradient fields are preferably the same; however, these fields are preferably phase-shifted 90° with respect to one another.

23 Claims, 3 Drawing Sheets

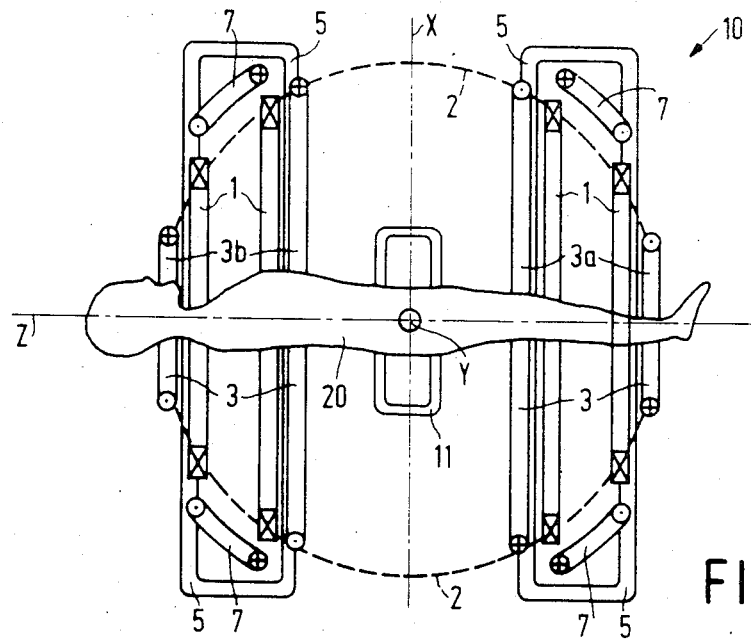
FIG.1
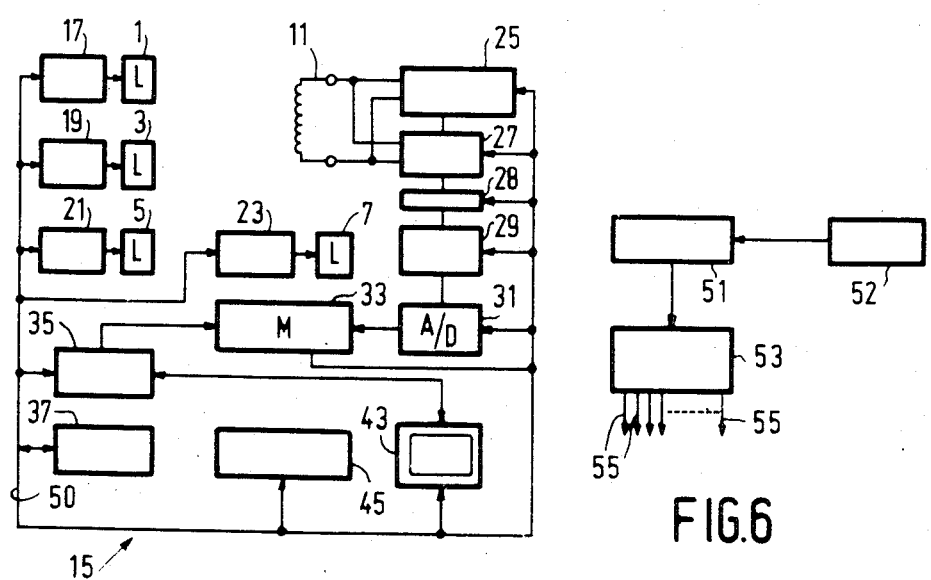
FIG.2
FIG.6

FAST METHOD AND DEVICE FOR DETERMINING AN NMR DISTRIBUTION IN A REGION OF A BODY

This is a continuation of application Ser. No. 774,129 filed Sept. 9, 1985, now abandoned.

BACKGROUND OF THE INVENTION

The invention relates to a method of determining an NMR distribution in a region of a body which is situated in a steady, uniform magnetic field, including the steps of:

(a) generating an r.f. electromagnetic pulse in order to cause a precessional motion of the magnetization of the nuclei in the body, thus generating a resonance signal, (b) then generating, after a preparation period, a steady gradient magnetic field and an alternating, periodic gradient magnetic field during a measurement period of several measurement periods, said measurement period (periods) being divided into a number of sampling intervals for taking a number of signal samples of the resonance signal, (c) then repeating, each time after a waiting period, the steps (a) and (b) a number of times, the duration of the preparation period and/or the integral over the preparation period of at least one gradient magnetic field applied during the preparation period each time having a different value in order to obtain a group of signal samples from which, after signal transformation thereof, an image of a nuclear magnetization is determined.

The invention also relates to a device for determining an NMR distribution in a region of a body, comprising:

(a) means for generating a steady, uniform magnetic field, (b) means for generating r.f. electromagnetic radiation, (c) means for generating a steady gradient magnetic field, (d) means for generating an alternating, periodic gradient magnetic field, (e) sampling means for taking signal samples of a resonance signal generated by the means specified in the paragraphs (a) and (b) in the presence of a steady gradient magnetic field and of an alternating gradient magnetic field generated by the means specified in paragraphs (c) and (d), (f) processing means for processing of the signal samples in order to obtain an NMR distribution, and (g) control means for controlling at least the means specified in the paragraphs (b) to (f) for generating, conditioning, and sampling a number of resonance signals and for processing the signal samples.

Such a method and device are known from Netherlands patent application NL-A No. 82.03519 corresponding to U.S. Pat. No. 4,527,124. According to the known method, a periodic alternating gradient magnetic field is generated during the measurement period, the period of said gradient field being equal to the sampling interval, at least one additional signal sample being taken in each sampling interval.

As explained in said Netherlands patent application NL-A No. 82.03519, the use of the alternating gradient magnetic field and the taking of the additional signal samples ensure that at least two rows of a (two-dimensional) image frequency matrix will have been filled after the sampling of a resonance signal (FID or spin echo signal). Thus, the duration of a measurement cycle is reduced to one half (one third, one quarter) when one (two, three) additional signal samples are taken, respectively. Because the duration of a resonance signal amounts to only some tens of milliseconds, the taking of 128 or 256 signal samples (in a row in the image frequency matrix) will require a sampling interval in the order of magnitude of 100 $\mu$s, which means that the frequency of the additional gradient magnetic field must amount to 10 kHz. This comparatively high frequency of the alternating gradient magnetic field limits the maximum number of rows of the image frequency matrix which can be filled by the sampling of a single resonance signal. The maximum distance $\Delta k$ between two rows filled by the sampling of a resonance signal amounts to:

$$\Delta k = \int_0^{\frac{1}{2}t_m} \gamma \cdot G(\tau) \cdot d\tau$$

in which $\frac{1}{2}t_m$ is the first half period of the periodic, alternating gradient magnetic field, $\gamma$ is the gyromagnetic ratio, and $G(\tau)$ is the alternating gradient magnetic field. The maximum distance $\Delta k$ determines the maximum number of rows in the image frequency matrix filled after the sampling of a resonance signal and is proportional to the amplitude of the applied alternating gradient magnetic field. The amplitude of the alternating gradient magnetic field cannot be increased at random, because the rate of change dG/dt of the alternating gradient magnetic field must remain within health safety limits imposed. This rate of change dG/dt is proportional to the product of the amplitude and the frequency of the alternating gradient magnetic field. Because the frequency (10 kHz) is comparatively high, a maximum permissible amplitude will be quickly reached. If the period of time required for collecting all signal samples were to be reduced to one quarter, the amplitude of the alternating field would have to be increased by a factor 4.

SUMMARY OF THE INVENTION

It is the object of the invention to provide a method and a device in which, utilizing comparatively weaker alternating gradient magnetic fields, the time required to form an image having a resolution which at least equals that obtained with the prior art method and device is substantially reduced when three-dimensional images of NMR-distributions are made.

To achieve this, the method in accordance with the invention is characterized in that during the measurement period, a second periodic alternating gradient magnetic field is applied whose gradient direction extends perpendicularly to the gradient direction of the first-mentioned alternating gradient magnetic field. According to the method of the invention, during a single FID-signal, the signal samples are measured not only along an image frequency line or in a flat image frequency plane, but in a 3-D part of the image frequency space which can now be covered due to the additional degree of freedom offered by the second alternating gradient magnetic field.

A preferred version of the method in accordance with the invention is characterized in that the two periodic alternating gradient magnetic fields have the same period and are phase-shifted 90° with respect to one another. In the preferred version of the method in accordance with the invention, the image frequency space (or image frequency time domain in the case of location-dependent spectroscopy) is covered via a helical path. Thus, per period four signal samples can be taken which are situated at the corners of a square circumscribed by the projected helix. Consequently, the overall measurement period will be reduced by a factor of four; however, two alternating gradient fields will then be required which effectively produce a gradient field which is a factor $\sqrt{2}$ stronger than a single gradient field in accordance with the present state of the art (with the same frequency) which reduces the overall measurement period only to one half.

A further inventive method of determining an NMR distribution in a region of a body which is situated in a steady, uniform magnetic field, including the steps of:

(a) generating an r.f. electromagnetic pulse in order to cause a precessional motion of the magnetization of the nuclei in the body, thus generating a resonance signal, (b) then generating, after a preparation period, an alternating, periodic gradient magnetic field during a measurement period or several measurement periods, said measurement period (periods) being divided into a number of sampling intervals for taking a number of signal samples of the resonance signal, (c) then repeating, each time after a waiting period, the steps (a) and (b) a number of times, the integral over the preparation period of at least one gradient magnetic field applied during the preparation period having a different value during each repetition in order to obtain a group of signal samples from which, after signal transformation thereof, an image of a nuclear magnetization is determined, characterized in that during the measurement period, a second periodic alternating gradient field is applied whose gradient direction extends perpendicularly to the gradient direction of the first-mentioned alternating gradient magnetic field.

A device in accordance with the invention is characterized in that it comprises means for generating two alternating gradient magnetic fields whose gradient directions are mutually perpendicular.

A preferred embodiment of a device in accordance with the invention is characterized in that the periods of the alternating gradient fields are the same and 90° out of phase.

BRIEF DESCRIPTION OF THE DRAWING

Embodiments in accordance with the invention will be described in detail hereinafter with reference to the drawing, wherein:

FIG. 1 diagrammatically shows a coil system of a device for performing a method in accordance with the invention, FIG. 2 shows a block diagram of a device for performing the method in accordance with the invention, FIG. 6 shows a part of a device for performing the method in accordance with the invention.

DESCRIPTION OF THE PREFERRED EMBODIMENTS

Figure 3A:
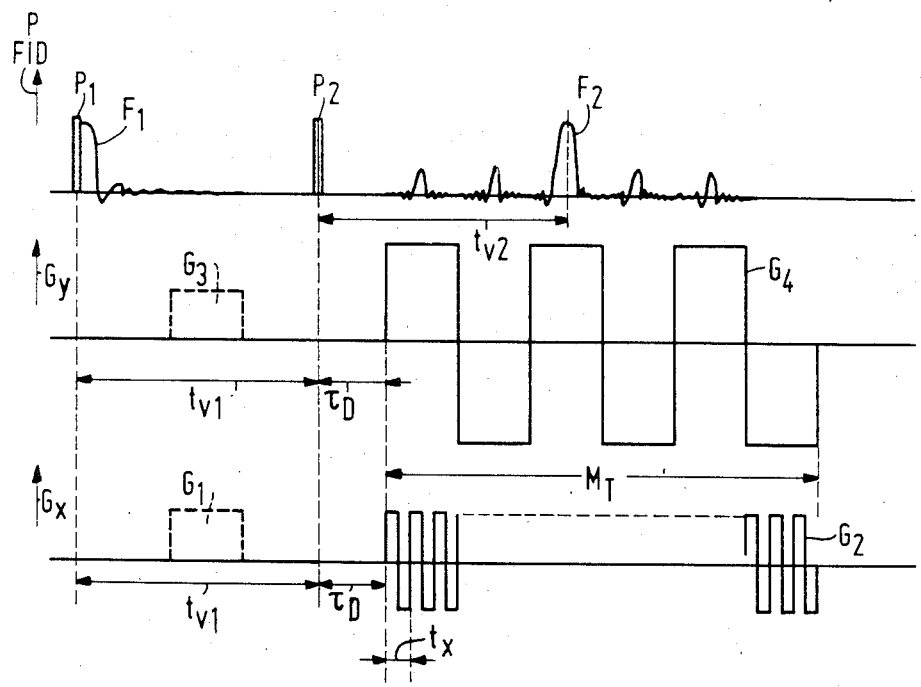
FIGS. 3a and 3b show simple embodiments and methods in accordance with the invention.

FIG. 1 shows a coil system 10 which forms part of a device 15 (FIG. 2) used for determining an NMR distribution in a region of a body 20. The region has a thickness of, for example $\Delta z$ and is situated in the x-y-plane of the x-y-z-coordinate system shown in FIG. 1. The y-axis of the system extends upwards perpendicularly to the plane of drawing. The coil system 10 generates a steady, uniform magnetic field Bo having a field direction parallel to the z-axis, three gradient magnetic fields $G_x$, $G_y$, $G_z$ having a field direction parallel to the z-axis and a gradient direction parallel to the x, y and z-axis, respectively, and an r.f. magnetic field. To achieve this, the coil system 10 comprises a set of main coils 1 for generating the steady, uniform magnetic field Bo. The main coils 1 may be arranged, for example on the surface of a sphere 2 whose centre is situated at the origin O of the cartesian coordinate system x, y, z shown, the axes of the main coils 1 being coincident with the z-axis.

The coil system 10 also comprises four coils 3a, 3b for generating the gradient field $G_z$. To achieve this, a first set 3a is excited by current in the opposite sense with respect to the current direction in the second set 3b; this is denoted by ⊙ and ⊗ in the Figure. Therein, ⊙ means a current entering the section of the coil 3 and ⊗ means a current leaving the section of the coil.

The coil system 10 furthermore comprises four rectangular coils 5 (only two of which are shown) or four other coils such as, for example "Golay coils", for generating the gradient magnetic field $G_y$. In order to generate the gradient magnetic field $G_x$, use is amde of four coils 7 which have the same shape as the coils 5 and which have been rotated through an angle of 90° about the z-axis with respect to the coils 5. FIG. 1 also shows a coil 11 for generating and detecting an r.f. electromagnetic field.

FIG. 2 shows a device 15 for performing a method in accordance with the invention. The device 15 comprises coils 1, 3, 5, 7 and 11 which have already been described with reference to FIG. 1, current generators 17, 19, 21 and 23 for energizing the coils 1, 3, 5 and 7, respectively, and an r.f. signal generator 25 for energizing the coil 11. The device 15 also comprises an r.f. signal detector 27, a demodulator 28, a sampling circuit 29, processing means such as an analog-to-digital converter 31, a memory 33 and an arithmetic circuit 35 for performing a Fourier transformation, a control unit 37 for controlling the sampling instants, and also a display device 43 and central control means 45 whose functions and relationships will be described in detail hereinafter.

The described device 15 performs a method of determining the NMR distribution in a region of a body 20 as will be described herreinafter. The method involves the frequent repetition of a measurement cycle which itself can be divided into several steps. During a measurement cycle, a part of the nuclear spins present in the body is resonantly excited. For resonant excitation of the nuclear spins, the current generator 17 is switched on by the central control unit 45, so that the coil 1 is energized and remains energized for a desired number of measurement cycles. Thus, a steady and uniform magnetic field Bo is generated. Furthermore, the r.f. generator 25 is switched on for a short period of time, so that the coil 11 generates an r.f. electromagnetic field. The nuclear spins in the body 20 can be excited by the applied magnetic fields and the excited nuclear magnetization takes up a given angle, for example 90° (90° r.f. pulse) with respect to the direction of the uniform magnetic field Bo. The location where and which nuclear spins will be excited depends inter alia on the intensity of the field Bo, on any gradient magnetic field which may be applied, and on the angular frequency $\omega_o$ of the r.f. electromagnetic field, because the equation $\omega_o = \gamma \cdot B_o$ (1) must be satisfied, in which $\gamma$ is the gyromagnetic ratio (for free protons, for example H$_2$O protons, $\gamma/2\cdot\pi = 42.576$ MHz/T). After an excitation period, the r.f. generator 25 is switched off by the central control means 45. The resonant excitation is always performed at the beginning of each measurement cycle. For some versions r.f. pulses are generated also during the measurement cycle. These r.f. pulses are then, for example a series composed of 180° r.f. pulses which are periodically generated. The latter is referred to as "spin echo". Spin echo is inter alia described in the article by I. L. Pykett "NMR in Medicine", published in Scientific American, May 1982.

During a next step signal samples are collected. For this purpose use can be made of the gradient fields which are generated by the generators 19, 21 and 23, respectively, under the control of the central control means 45. The detection of the resonance signal (referred to as FID signal) is performed by switching on the r.f. detector 27, the demodulator 28, the sampling circuit 29, the analog-to-digital converter 31 and the control unit 37. This FID signal appears as a result of the precessional motion of the nuclear magnetizations about the field direction of the magnetic field Bo due to the r.f. excitation pulse. This nuclear magnetization induces an induction voltage in the detection coil whose amplitude is a measure of the nuclear magnetization.

The analog sampled FID signals originating from the sampling circuit 29 are digitized (converter 31) and stored in a memory 33. After a final signal sample has been taken during a measurement period $M_T$, the central control means 45 deactivate the generators 19, 21 and 23, the sampling circuit 29, the control unit 37 and the analog-to-digital converter 31.

The sampled FID signal is and remains stored in the memory 33. Subsequently, a next measurement cycle is performed during which an FID signal is generated, sampled and stored in the memory 33. When a sufficient number of FID signals has been measured (the number of FID signals to be measured depends, for example on the desired resolution), an NMR-image can be determined via a 2-D or 3-D Fourier transformation (this depends on the use of the gradient magnetic fields under whose effect the FID signals are generated and sampled). FIG. 3a shows an example of a measurement cycle in accordance with the invention which will be illustrated with reference to the device 15 shown in FIG. 2. Using the r.f. coil 11, a 90° pulse P$_1$ is generated after the switching-on of the main coils 1 generate a steady, uniform magnetic field Bo. The resonance signal F1 which results is allowed to decay when using the spin echo technique and after a period of time $t_{v1}$, a 180° pulse P$_2$ is generated by the r.f. coil 11. During a part of the period $t_{v1}$, gradient fields G$_x$ and G$_y$ (denoted by curves G$_1$ and G$_3$) are generated for reasons to be described hereinafter. After a period of time $t_{v2}$ which is equal to $t_{v1}$, an echo resonance signal F2 produced by the 180° pulse P$_2$ will reach a peak value. The use of the so-called spin echo technique (180° pulse P$_2$) prevents the occurrence of phase errors in the resonance signals produced by nuclear spins; such phase errors are caused by inhomogeneities in the steady magnetic field Bo. The echo resonance signal is sampled each time after a sampling interval $t_m$ (not shown in the Figure) in the presence of alternating gradient fields G$_x$ and G$_y$ which are denoted by curves G$_2$ and G$_4$, respectively.

It is known that the phase angle of a magnetization at a point z in a gradient magnetic field G$_z$ is determined by $$\int^t \gamma \cdot G_z \cdot z \cdot d\tau$$

Thus, an image frequency k$_z$ can be defined as:

$$k_z = \gamma \cdot \int^t G_z \cdot d\tau$$

Thus, after each sampling period $t_m$ a respective signal sample is determined which is associated with a different image frequency k$_z$. The successive image frequencies exhibit an image frequency difference $$\Delta k_z = \gamma \cdot \int_{t_m} G_z \cdot d\tau$$

It will be apparent that when an alternating gradient field G$_x$ is applied, signal samples are obtained which are associated with image frequencies k$_x$ which will be situated between two extreme values k$_{xi}$ and $$\gamma \cdot \int_{t_x/2} G_2 d\tau + k_{xi}.$$

Figure 3B:
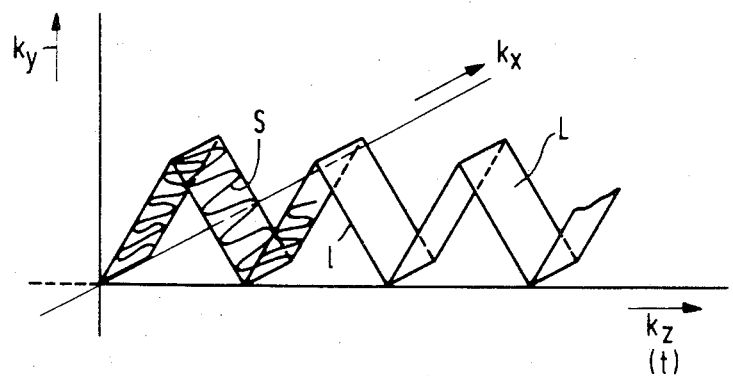

The quickly alternating G$_y$ gradient field G$_2$ is now superposed on a slowly alternating G$_y$ gradient field G$_4$. If this G$_y$ gradient field G$_4$ were present and also a constant G$_x$ gradient field (not shown), the successive signal samples to be taken would be associated with the image frequencies (k$_y$, k$_z$), k$_y$ then varying between two extreme values as denoted by the line 1 in FIG. 3b. When the alternating G$_y$ gradient magnetic field as well as the alternating G$_x$ gradient field and a constant G$_z$ gradient field are applied, the path S on which the signal samples to be taken during the measurement period $M_T$ are situated will form as if it were a band-shaped plane L which passes through the line 1 and which has a width which is determined by the two extreme values $$\left( k_{xi} \text{ and } k_{xi} + \gamma \int_{\frac{1}{2}t_x} \cdot G_2 \cdot d\tau \right)$$

of k$_x$. Because sampling takes place with three degrees of freedom during an FID signal in accordance with the present method {(k$_x$, k$_y$, k$_z$) or, for example k$_x$, k$_y$, t) for spectroscopy}, more signal samples can be derived per FID signal, so that the overall measurement period for the filling of a 3-D (or 4-D) matrix with signal samples is drastically reduced. By application of G$_x$ and/or G$_y$ preparation gradient magnetic fields G$_1$ and/or G$_3$ during the preparation period $t_{v1}$, the band-shaped plane L can be shifted in the (k$_x$, k$_y$, k$_z$) or (k$_x$, k$_y$, t) space in the k$_x$ and/or the k$_y$-direction, so that a regular filling of said image frequency domain or image frequency-time domain is obtained. In order to counteract the effect of T$_2$ relaxation times and field inhomogeneities which cause ghost images and blurring, it is advantageous to take a signal sample associated with, for example the frequency plane $k_z$ always at the same relative instant after the excitation pulse $P_1$ (or echo pulse $P_2$). In the present example this can be achieved by choosing for each different presetting of the $G_y$ gradient field $G_3$ (actually the time integral thereover) an adapted instant $\tau_D$ for the switching-on of the alternating $G_x$ and $G_y$ gradient fields $G_2$ and $G_4$, the $G_2$ gradient magnetic field and the measurement period $M_T$ not being shifted in the "time domain".

Figure 4A:
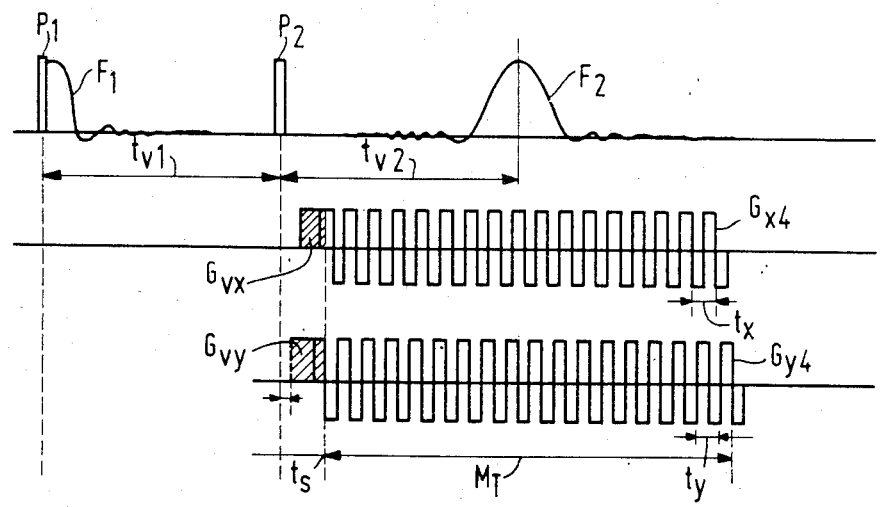
FIGS. 4a and 4b show a preferred version of a method in accordance with the invention.
Figure 4B:
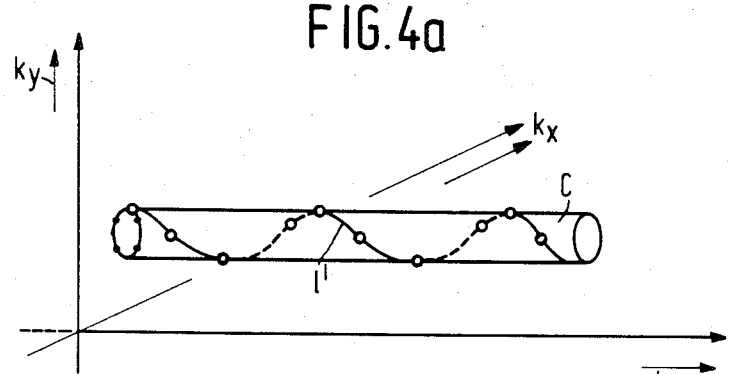

FIGS. 4a and 4b illustrate the principle of a preferred version of a method in accordance with the invention. According to this method, the applied $G_y$ gradient magnetic field $G_{y4}$ deviates from the $G_y$ gradient field $G_4$ shown in FIG. 3a. The gradient field $G_{y4}$ has the same period $t_y$, $t_x$ as the gradient field $G_{x4}$. The gradient fields $G_{x4}$ and $G_{y4}$ exhibit a phase difference of preferably 90°. It can be deduced that in the case of two alternating gradient fields thus applied, the image frequencies at which signal samples are taken are situated on an ellipse (a circle when the amplitudes $G_{x4}$ and $G_{y4}$ are equal) in the $k_x$—$k_y$ image frequency plane. When a constant gradient field $G_z$ is switched on simultaneously with the alternating gradient fields $G_{x4}$ and $G_{y4}$ (only during the measurement period $M_T$), the signal samples taken will be associated with image frequency triplets ($k_x$, $k_y$, $k_z$) which are situated on a helix $l'$ which is wound about the elliptical cylinder C (circular cylinder if $G_{x4} = G_{y4}$) with a constant pitch. By shifting the phases of the $G_x$ and the $G_y$ gradient fields $G_{x4}$ and $G_{y4}$ with respect to the starting instant $t_s$ of the measurement period $M_T$, the helix can be rotated about the cylinders (in order to achieve a more uniform coverage of the cylinder surface, if necessary). The cylinder C itself can be shifted in the $k_x$ and/or $k_y$-direction by varying the preparation gradient fields $G_{vx}$ and/or $G_{vy}$ (the shaded surfaces) as regards amplitude and/or time, so that a uniform filling of the ($k_x$, $k_y$, $k_z$) space or ($K_x$, $k_y$, t) space can be realized (the starting instant $t_s$ is then fixed in time with respect to the pulse $P_1$ (or $P_2$) before the start of each measurement period).

Figure 5A:
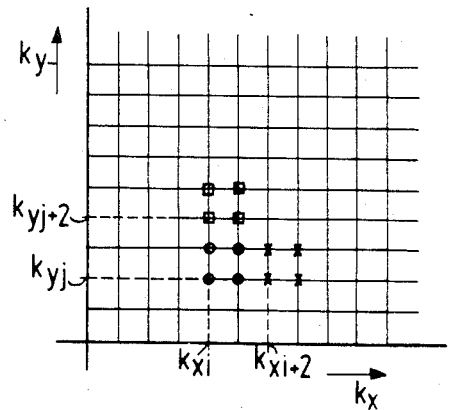
FIGS. 5a and 5b illustrate the method shown in the FIGS. 4a and 4b.
Figure 5B:
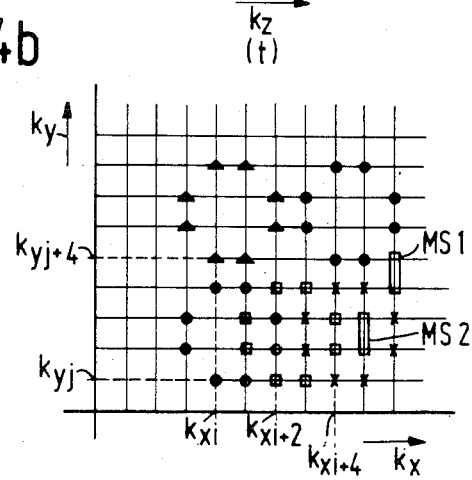

FIG. 5a is a projection perpendicularly to the $k_x$—$k_y$ plane of all measurement points obtained along three helices. As appears from FIG. 5a, when four signal samples are taken per turn of the helix, a uniform filling on cartesian coordinates $k_x$, $k_y$ is possible. When the amplitude of the gradient fields $G_{x4}$ and $G_{y4}$ is increased whilst their frequency is decreased, an equal number of signal samples can be taken with less energy and a lower dG/dt in the same period of time, whilst a "cartesian" filling in the $k_x$ and $k_y$ direction is still feasible. Instead of four signal samples, eight signal samples are now taken per turn of the helix $l'$ (see FIG. 4b) (however, the sampling is no longer equidistant in time), said samples being situated at the corners of octagons which are denoted by 0, □, x, △ and . in FIG. 5b. By allowing the "cylinders" to overlap, a cartesian filling of the $k_x$—$k_y$ plane is achieved (see, for example □, 0, x). A phase correction is required only in the $k_z$-direction, said correction being different for seven signal samples successively situated on a helix (assuming that one of the eight is "correctly" situated on the $k_z$ grid); this is also applicable to three of the four signal samples measured according to FIG. 5a. The phase correction to be used is already known from U.S. Pat. No. 4,527,124. Furthermore, it is necessary to fill the holes MS1 and MS2 occurring at the edge of the $k_x$—$k_y$ space to be filled with missing signal samples. Because each time two adjacent signal samples are concerned ($k_x$=constant), said holes MS1 and MS2 can be successively filled by means of the method described in U.S. Pat. No. 4,527,124 ($G_z$=constant, $G_y$ is modulated).

The methods described with reference to the FIGS. 4a, b and 5a, b are also very suitable for NMR spectroscopy; to this end, for example it is not necessary to apply a gradient field during the measurement period $M_T$; it is merely necessary to realize a presetting $k_z$ with a gradient field $G_z$ during the preparation period (for example during $t_{v1}$ or after $P_2$ and before $t_s$).

For the selection/adjustment of a given pulse sequence, time intervals and associated gradient magnetic fields for a measurement cycle, use is made of programmed computer means. In an embodiment of the device 15 (FIG. 2) the central control means 45 comprise a programmed computer (VAX 11/730) which comprises an input/output station 52 for control data and an interface 53 (see FIG. 6). Outputs 55 of the interface 53 are connected, via the bus 50 (see FIG. 2), to the current generators 19, 21, 23 and 25 to be controlled as well as to the control inputs of the receiver 27, the demodulator 28 and the sampling circuit 29.

What is claimed is:

1. A method of determining an NMR distribution in a region of a body situated in a steady, uniform magnetic field, said method comprising the steps of:
    (a) generating an r.f. electromagnetic pulse during a preparation period in order to cause a precessional motion of the magnetization of the nuclei in the body so as to generate a resonance signal,
    (b) then during a subsequent measurement period, generating a steady gradient magnetic field, a first alternating, periodic gradient magnetic field with a gradient direction extending in a first direction and a second alternating, periodic gradient magnetic field with a gradient direction extending perpendicularly to said first direction, said measurement period being divided into a number of sampling intervals,
    (c) during said measurement period taking a sample of said resonance signal during each of said sampling intervals so as to obtain a plurality of signal samples, and
    (d) then repeating, each time after a waiting period, steps (a), (b) and (c), said preparation period having a different duration during each repetition so as to obtain a group of signal samples from which, after Fourier transformation thereof, an image of a nuclear magnetization is determined.

2. A method as claimed in claim 1 wherein said first and second alternating gradient magnetic fields have the same period and are phase-shifted with respect to one another.

3. A method as claimed in claim 2, wherein said first and second alternating gradient magnetic fields are 90° out of phase.

4. A method as claimed in claim 1, 2 or 3, characterized wherein per period of an alternating gradient magnetic field a signal sample is taken at least four times.

5. A method as claimed in claim 1, 2 or 3, wherein the starting instant of one of said first and second alternating gradient magnetic fields coincides with the end of the preparation period, the instant at which a first signal sample is taken always commencing the same time interval after the r.f. electromagnetic pulse.

6. A method as claimed in claim 1, 2 or 3, wherein during the successive measurement periods the amplitudes of the alternating gradient magentic fields are the same.

7. A method as claimed in claim 1, wherein eight signal samples are taken per period of an alternating gradient magnetic field.

8. A method as claimed in claim 1, 2 or 3, wherein the periods of said alternating gradient magnetic fields generated during successive measurement periods are different and the ratio of the maximum field intensity of the total alternating gradient magnetic field resulting from summation of the individual alternating gradient fields and the period is always smaller than or equal to a predetermined, fixed value.

9. A device for determining an NMR distribution in a region of a body, said device comprising:
(a) means for generating a steady, uniform magnetic field,
(b) means for generating r.f. electromagnetic radiation so as to produce processional motion of the magnetization of nuclei in the body disposed in said uniform field and thereby generate a resonance signal,
(c) means for generating a steady, gradient magnetic field,
(d) means for generating at least two alternating, periodic gradient magnetic fields whose gradient directions are mutually perpendicular,
(e) sampling means for taking signal samples of said resonance signal in the presence of said alternating gradient magnetic fields,
(f) control means for controlling at least the means specified in paragraphs (b) to (e) so as to generate and sample a plurality of said resonance signals during successive measurement cycles,
(g) processing means controlled by said control means for processing said signal samples taken during said measurement cycles so as to obtain an NMR distribution therefrom.

10. A device as claimed in claim 9, wherein the periods of the alternating gradient magnetic fields are the same and 90° out of phase.

11. A device as claimed in claim 9 or 10, wherein the period of the alternating gradient magnetic fields is adjustable.

12. A device as claimed in claim 11, wherein the intensity of the alternating gradient magnetic fields is adjustable.

13. A method of determining an NMR distribution in a region of a body situated in a steady, uniform magnetic field, said method comprising the steps of:
(a) generating, during a preparation period, an r.f. electromagnetic pulse in order to cause a precessional motion of the magnetization of nuclei in the body so as to generate a resonance signal,
(b) generating, during said preparation period, at least one preparation gradient magnetic field,
(c) then during a subsequent measurement period, generating a first alternating, periodic gradient magnetic field with a gradient direction extending in a first direction and a second alternating, periodic gradient magnetic field with a gradient direction which extends perpendicularly to said first direction, said measurement period being divided into a number of sampling intervals,
(d) during said measurement period, taking a sample of said resonance signal during each of said sampling intervals so as to obtain a plurality of signal samples, and
(e) then repeating, each time after a waiting period, steps (a), (b), (c), and (d), the integral over the preparation period of said at least one preparation gradient magnetic field having a different value during each repetition in order to obtain a group of said signal samples from which, after Fourier transformation thereof, an image of a nuclear magnetization is determined.

14. A method as claimed in claim 13, wherein said first and second alternating gradient magnetic fields have the same period and are phase-shifted with respect to one another.

15. A method as claimed in claim 14, wherein said first and second alternating gradient magnetic fields are 90° out of phase.

16. A method as claimed in claim 13, 14 or 15, wherein, per period of an alternating gradient magnetic field, a signal sample is taken at least four times.

17. A method as claimed in claim 13, 14 or 15, wherein one of said first and second alternating gradient magnetic fields starts at an instant which coincides with the end of the preparation period, the instant at which a first signal sample is taken always commencing the same time interval after the r.f. electromagnetic pulse.

18. A method as claimed in claim 13, 14 or 15, wherein the amplitudes of the respective alternating gradient magnetic fields are the same during successive measurement periods.

19. A method as claimed in claim 13, 14 or 15, wherein during the preparation period at least two of said preparation gradient magnetic fields are generated, the integral over the period of at least one preparation gradient magnetic field having a different value in two successive measurement periods.

20. A method as claimed in claim 19, wherein the gradient direction of one of said two preparation gradient magnetic fields is the same as the gradient directions of a respective one of the two alternating gradient magnetic fields and the gradient direction of the other preparation gradient magnetic field is the same as the gradient direction of the other alternating gradient magnetic field.

21. A method as claimed in claim 13, wherein eight signal samples are taken per period of an alternating gradient magnetic field.

22. A method as claimed in claim 13, 14 or 15, wherein the periods of said alternating gradient magnetic fields generated during successive measurement periods are different and the ratio of the maximum field intensity of the total alternating gradient magnetic field resulting from summation of the individual alternating gradient fields and the period is always smaller than or equal to a predetermined, fixed value.

23. A method as claimed in claim 13, 14 or 15, wherein a steady gradient magnetic field is generated during said measurement period.

* * * * *